(12) United States Patent
Vincent et al.

(10) Patent No.: US 8,530,339 B2
(45) Date of Patent: Sep. 10, 2013

(54) METHOD FOR DIRECT DEPOSITION OF A GERMANIUM LAYER

(75) Inventors: Benjamin Vincent, Elsene (BE); Matty Caymax, Leuven (BE); Roger Loo, Leuven (BE); Johan Dekoster, Herent (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/347,834

(22) Filed: Jan. 11, 2012

(65) Prior Publication Data

US 2012/0175741 A1    Jul. 12, 2012

(30) Foreign Application Priority Data

Jan. 11, 2011    (EP) ..................................... 11150559

(51) Int. Cl.
*H01L 29/16* (2006.01)

(52) U.S. Cl.
USPC .......................................... 438/478; 438/479

(58) Field of Classification Search
USPC .................................. 257/616; 438/478, 479
See application file for complete search history.

(56) References Cited

U.S. PATENT DOCUMENTS

| | | | |
|---|---|---|---|
| 4,363,828 A | 12/1982 | Brodsky et al. | |
| 7,022,593 B2 * | 4/2006 | Arena et al. | 438/494 |
| 7,115,521 B2 * | 10/2006 | Brabant et al. | 438/706 |
| 2002/0168868 A1 | 11/2002 | Todd | |
| 2003/0111013 A1 | 6/2003 | Oosterlaken et al. | |
| 2004/0005740 A1 | 1/2004 | Lochtefeld et al. | |
| 2005/0054175 A1 | 3/2005 | Bauer | |
| 2008/0164579 A1 | 7/2008 | McFeely et al. | |
| 2009/0140251 A1 | 6/2009 | Yamazaki | |
| 2010/0197084 A1 | 8/2010 | Yeo et al. | |

FOREIGN PATENT DOCUMENTS

| | | |
|---|---|---|
| EP | 0484056 A1 | 5/1992 |
| WO | WO2004/084268 A2 | 9/2004 |
| WO | WO2007/138063 A1 | 12/2007 |

OTHER PUBLICATIONS

European Search Report, European Patent Application No. 11150559 dated Feb. 22, 2011.
Greenlief, C. Michael et al., "Surface Investigations of Germanium Chemical Vapor Deposition on Silicon", Mat. Res. Soc. Symp. Proc., vol. 282, 1993, pp. 427-432.
Wistey, M.A. et al., "Chemical Routes to Ge/Si(100) Structures for Low Temperatures Si-Based Semiconductor Applications", Applied Physics Letters, vol. 90, 2007, pp. 082108-1-082108-3.

* cited by examiner

Primary Examiner — Roy Potter
(74) Attorney, Agent, or Firm — McDonnell Boehnen Hulbert & Berghoff LLP

(57) ABSTRACT

The present disclosure is related to a method for the deposition of a continuous layer of germanium on a substrate by chemical vapor deposition. According to the disclosure, a mixture of a non-reactive carrier gas and a higher order germanium precursor gas, i.e. of higher order than germane ($GeH_4$), is applied. In an example embodiment, the deposition is done under application of a deposition temperature between 275° C. and 500° C., with the partial pressure of the precursor gas within the mixture being at least 20 mTorr for temperatures between 275° C. and 285° C., and at least 10 mTorr for temperatures between 285° and 500° C.

16 Claims, 3 Drawing Sheets

METHOD FOR DIRECT DEPOSITION OF A GERMANIUM LAYER

CROSS-REFERENCE TO RELATED APPLICATIONS

This application claims priority to European Patent Application Ser. No. 11150559.0 filed Jan. 11, 2011, the contents of which are hereby incorporated by reference.

FIELD OF THE DISCLOSURE

The present disclosure is related to semiconductor processing, in particular to the deposition of Germanium layers by Chemical Vapor Deposition (CVD).

STATE OF THE ART

According to the present state of the art, the CVD-deposition of polycrystalline or amorphous Ge-layers on a $SiO_2$ layer using germane ($GeH_4$) as the Ge-precursor is not possible without the deposition of a silicon seed layer on the $SiO_2$ layer. Without the seed layer, no Ge-growth of a continuous, i.e. uniform and closed Ge layer is possible due to the formation of germanium suboxides (by reaction between the Ge and oxide) which are volatile and therefore desorb at the growth temperature. On a substrate comprising areas of Si and areas of $SiO_2$, the Ge-growth is thus said to be selective, i.e. a continuous Ge is grown on the Si-areas but not on the $SiO_2$ areas.

The presence of a Si-seed layer is undesirable in some applications, but a method for growing a pure and continuous Ge layer directly on $SiO_2$ is not available at present.

Instead of $GeH_4$, higher order germanium precursors, in particular digermane ($Ge_2H_6$) and trigermane ($Ge_3H_8$) have been applied in combination with Si-precursors in the CVD-production of SiGe layers. Document US-A-2003111013 for example describes a process and apparatus which allows SiGe deposition on $SiO_2$ without a seed layer, and utilizing one of $GeH_4$, $Ge_2H_6$ $Ge_3H_8$ or tetrachlorogermane ($GeH_{1-x}Cl_x$, x=1-4) as the Ge-precursor and one of silane ($SiH_4$), disilane ($Si_2H_6$) trisilane ($Si_3H_8$) or tetrachlorosilane ($SiHCl_4$) as the Si precursor. No indication is given as to the process parameters for producing a pure Ge layer without applying a seed layer.

It is concluded that the prior art lacks a method for depositing pure Ge layers on $SiO_2$. The present disclosure aims to provide such a method.

SUMMARY OF THE DISCLOSURE

The disclosure is related to a method and to devices as disclosed in the appended claims. As such, the disclosure is related to a method for depositing a continuous germanium layer on a substrate surface, comprising the steps of:
  Providing a substrate,
  Introducing said substrate into a reaction chamber suitable for applying a layer onto said surface by chemical vapor deposition (CVD),
  Introducing in said chamber a gas mixture comprising a germanium precursor gas and a non-reactive carrier gas, said germanium precursor gas being a higher order germane precursor compared to $GeH_4$,
  Depositing by CVD a continuous germanium layer overlying and in contact with said substrate surface.

According to example embodiments, said germanium precursor is $Ge_2H_6$ or $Ge_3H_8$. Said gas mixture may be at atmospheric pressure.

According to an example embodiment, said deposition step is performed at a deposition temperature between about 275° C. and about 500° C., and the partial pressure of the germanium precursor gas in said gas mixture is at least 20 mTorr when the deposition temperature is between about 275° C. and about 285° C., and at least 10 mTorr when the deposition temperature is higher than about 285° C. and up to about 500° C. The CVD deposition could take place by performing the following steps:
  heating the interior of said reaction chamber to a deposition temperature, and possibly while already supplying said carrier gas to the chamber,
  when the deposition temperature is reached, supplying the precursor gas and the carrier gas to the chamber, resulting in the deposition of the Ge layer on the substrate.

According to embodiments of the disclosure, said substrate surface comprises at least a surface area consisting of a material of the group consisting of:
  high-K dielectric materials,
  Silicon oxide,
  Si-nitrides or carbides,
  metals or metal nitrides or metal carbides.

According to specific embodiments said substrate surface comprises at least a surface area consisting of titanium nitride and/or least a surface area consisting of $SiO_2$.

Said gas mixture may further comprise a gas containing a doping element. Said gas containing a doping element may be $B_2H_6$ or $AsH_3$ or $PH_3$. Said carrier gas may be $H_2$ or $N_2$.

The disclosure is equally related to a substrate comprising a TiN layer at least on a part of the substrate surface and a continuous Ge layer overlying and in contact with said TiN layer.

The disclosure is equally related to a semiconductor device comprising a substrate according to the previous paragraph. The disclosure is equally related to a semiconductor device comprising a substrate produced by the method of the disclosure.

DETAILED DESCRIPTION

According to the method of the disclosure, a higher order Ge-precursor, such as digermane or trigermane ($Ge_2H_6$ or $Ge_3H_8$) is used as the germanium precursor gas in a gas mixture, which may include a gas mixture at atmospheric pressure, comprising or consisting of the Ge precursor gas, possibly a gas comprising dopant elements, and a non-reactive carrier gas, for example $N_2$ or $H_2$. The dopant element could be boron added to the mixture as $B_2H_6$ in gaseous form. Also n-type doping elements could be added, for example by adding $AsH_3$ or $PH_3$ to the mixture. From this mixture, a (possibly doped) continuous Ge layer is deposited by CVD on a substrate surface, e.g. on $SiO_2$, without requiring a Si seed layer. The Ge layer can be amorphous, polycrystalline or monocrystalline, mainly depending on the type of substrate onto which the layer is deposited. By a continuous layer is meant a layer that does not show island formation. The deposition method as such is conducted according to known CVD procedures, and may be executed in known CVD installations. The CVD technique applied in the method of the disclosure does not make use of plasma-assisted processes such as plasma enhanced CVD (PECVD).

The method of the disclosure is applicable on any type of substrate surface. According to the example embodiments, a Ge layer is deposited on a material on which it is impossible to directly deposit a continuous Ge layer by CVD from a gaseous phase comprising $GeH_4$ as the Ge-precursor. The main example of such a material is silicon oxide, in particular $SiO_2$. Other surfaces with which the disclosure could be applicable are layers of the following materials:

high-K dielectric materials, such as hafnium oxides, zirconium oxides, lanthanides oxides (lanthanum oxide, dysprosium oxide, gadolinium oxide, ytterbium oxide) and any combination thereof. These materials could show the same type of potential problems as silicon oxide in terms of the direct deposition of Ge with $GeH_4$ as the precursor, i.e. the formation of volatile Ge suboxides which desorb at the growth temperature, Si-nitrides or carbides (SiN, SiC), metals or metal nitrides/carbides (e.g. Hf, Zr, Al, Ti, TiN, Ta, Zr, Ru, TaN, TaC).

Metal nitrides or carbides could show problems when depositing Ge with $GeH_4$ as the precursor, even when a Si seed layer is deposited first. The inventors have established such problems in the case of a TiN surface (see further). Without wishing to be bound by theory, such problems could be caused by the presence of metal contamination at the Si/Ge interface.

Hereafter test results are described which were obtained on a silicon wafer of 200 mm in diameter having a surface comprising areas of Si and areas of $SiO_2$. The precursor used was $Ge_2H_6$ with $H_2$ as the carrier gas. These results are however applicable to other types of substrates, and other higher order Ge-precursors, such as $Ge_3H_8$, as well as other carrier gases (e.g. $N_2$).

Figure 1:
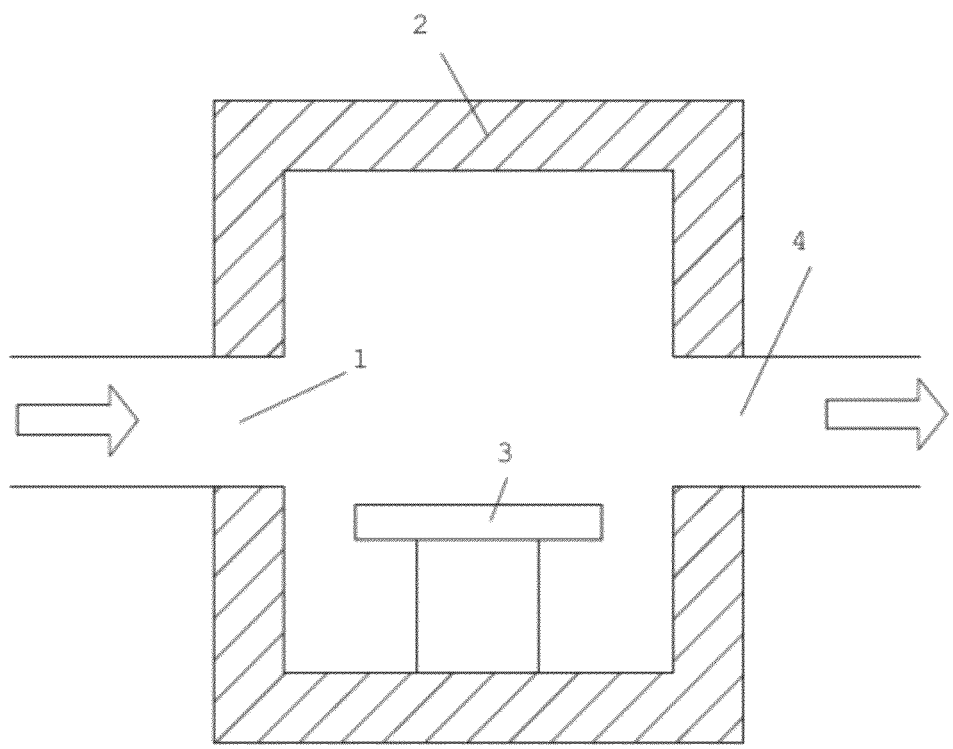
FIG. 1 shows a schematic view of a reactor suitable for the method of the disclosure.

The CVD deposition was done in a CVD reactor as schematically illustrated in FIG. 1 and not meant to limit the scope of the disclosure. The carrier gas and precursor gas are provided towards the inlet 1 of a reaction chamber 2, in which the substrate 3 is mounted. A heating system is provided to heat up the reactor and the substrate to a desired temperature. First the interior of the reaction chamber is heated to the deposition temperature, and in some embodiments, while a flow of the carrier gas is already supplied to the chamber. Suitable valve means (not shown) are provided to control the flow of gases towards the chamber. When the deposition temperature is reached, the precursor gas is added, and the mixture of the precursor and the carrier gas is supplied to the chamber, resulting in the deposition of the Ge layer on the substrate 3. Gases exit from the chamber through the outlet 4. In the tests of which the results are described hereafter, a flow rate of 20 l/min of $H_2$ carrier gas was supplied. The flow rates of the carrier gas and the precursor gas in their respective supply sections determine the partial pressure of the precursor gas in the mixture by the formula:

$$p_p = \frac{FR_p}{\Sigma F} * p_m$$

with: $p_p$ the partial pressure of the precursor gas, $FR_p$ the flow rate of the precursor gas (taking into account precursor dilution), $\Sigma F$ is the sum of all the flows in the chamber (all precursor gases+carrier gas), $p_m$ the total pressure in the reactor. Said total pressure may be atmospheric pressure or lower than atmospheric pressure. The application of the method at atmospheric pressure offers the advantage that higher partial pressures can be obtained for the same flow rates.

Figure 2:
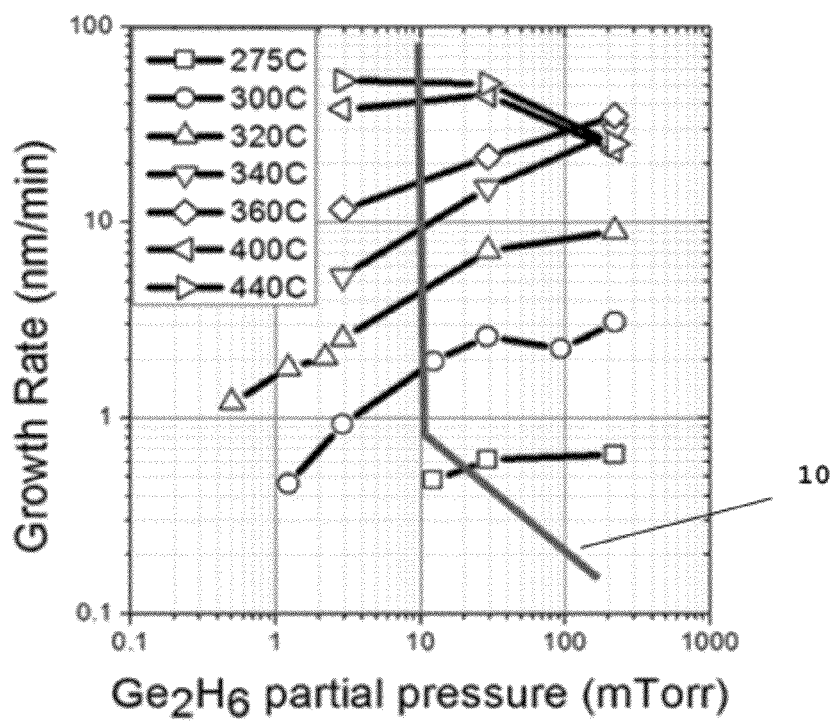
FIG. 2 shows the Ge growth rate as a function of the partial pressure of $Ge_2H_6$ at several deposition temperatures.

In FIG. 2, the growth rate of Ge on Si is shown as a function of the $Ge_2H_6$ partial pressure for different deposition temperatures. The line 10 represents the separation between test results showing selective growth, i.e. no nucleation on $SiO_2$ to the left of line 10, and test results showing non-selective growth, i.e. nucleation on $SiO_2$, to the right of line 10.

At temperatures lower than 275° C., Ge growth becomes so low as to be unworkable, on Si as well as on $SiO_2$. Above about 500° C., the growth was selective in every case, i.e. nucleation on Si but not on $SiO_2$. Between about 275° C. and 500° C., non-selective Ge growth could be obtained depending on the partial pressure of $Ge_2H_6$. At the lower end of the temperature range of 275° C.-500° C., a higher partial pressure is required (at least 20 mTorr), while starting from about 285° C., the partial pressure must be at least 10 mTorr. The maximum of the partial pressure is determined by practical circumstances (e.g. sufficient flow of carrier gas) and can differ as a function of the actual installation and materials used. These results prove that there is a window in terms of the deposition temperature, between about 275° C. and about 500° C., within which a continuous layer of pure Ge can be deposited directly by CVD on $SiO_2$, provided that the partial pressure of the high order Ge precursor is sufficiently high. The disclosure is equally related to a semiconductor device comprising a substrate produced by the method of the disclosure.

Figure 3A:
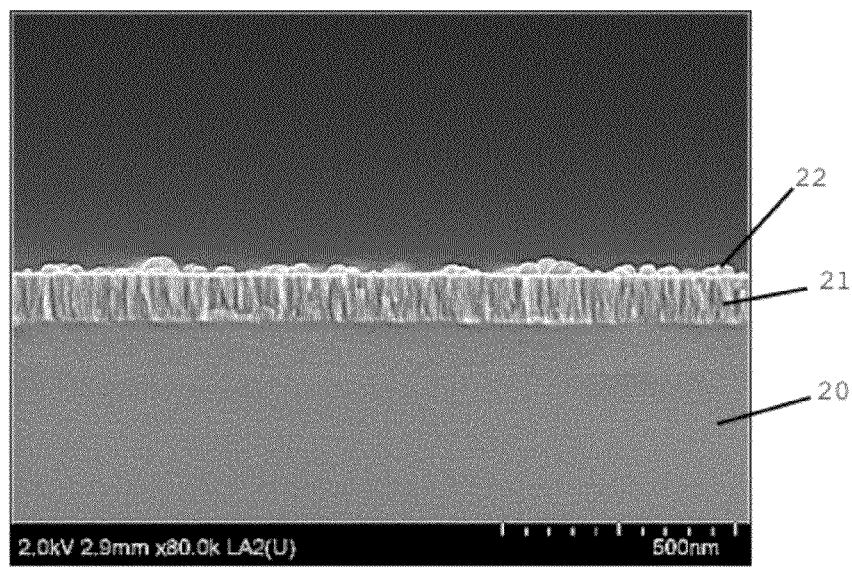
FIGS. 3a and 3b are SEM pictures illustrating the fact that no continuous Ge layer can be deposited on TiN starting from $GeH_4$ as the precursor, with or without a Si seed layer.
Figure 3B:
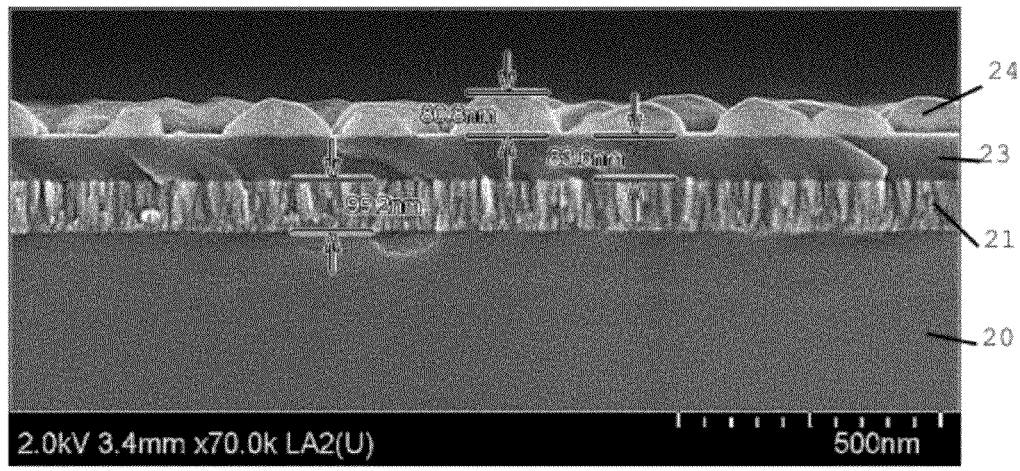

The method of the disclosure is especially applicable to the deposition of a continuous Ge layer on titanium nitride (TiN). It was found by the inventors that on TiN it was not possible to deposit Ge by using germane ($GeH_4$) as the precursor, not even with the application of a Si seed layer. Tests were done wherein Ge was deposited by CVD on a Si substrate provided with a TiN layer of about 100 nm thickness. In a first test, Ge was deposited directly on the TiN layer. In two further tests, Ge was deposited after deposition of a Si seed layer of about 40 nm thickness and in another test after deposition of a Si seed layer of about 85 nm in thickness. In each case, Ge growth occurred by formation of pillars or islands, not in a continuous layer. This is illustrated in FIGS. 3a and 3b. FIG. 3a shows the Si substrate 20, provided with TiN layer 21 and Ge layer 22 deposited from $GeH_4$ directly on the TiN. It is seen that the Ge layer is very irregular and not continuous. FIG. 3b shows the effect of a Si seed layer 23 of 86 nm. The Ge formation is still in the form pillars and islands 24. Without wishing to be bound by theory, it is believed that such problems are caused by metal contamination at the Si/Ge interface. Similar problems are expected for deposition on other types of metal, metal nitride or metal carbide surfaces.

Figure 4:
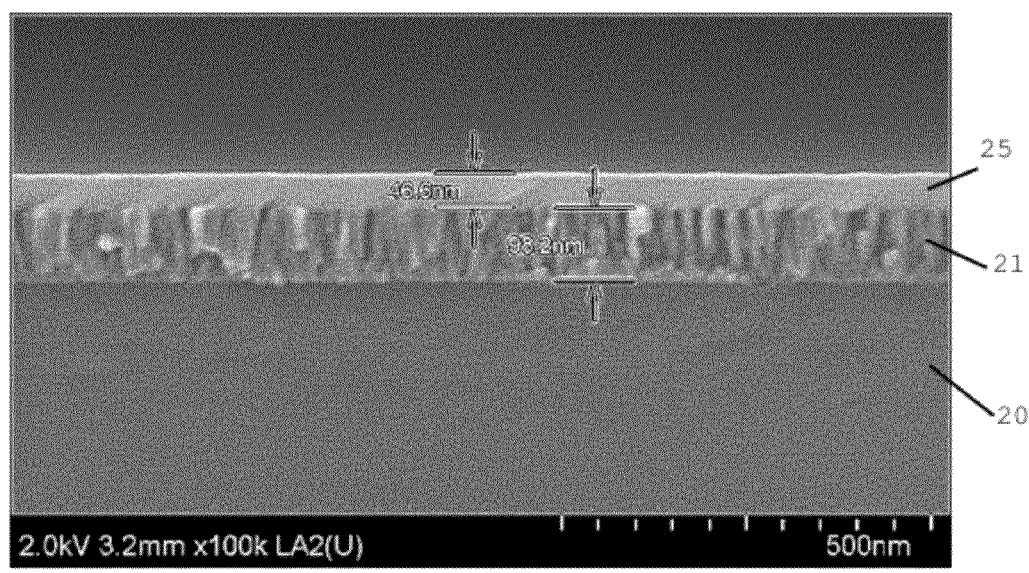
FIG. 4 demonstrates the formation of a continuous Ge layer directly on TiN, according to the method of the disclosure.

In a comparative test, a Si substrate provided with a TiN layer of 98.2 nm thick was subjected to the method of the disclosure, using $Ge_2H_6$ at 300° C., $H_2$ as carrier gas, the total pressure being atmospheric pressure and the partial pressure of $Ge_2H_6$ being 221 mTorr, in the installation as schematically shown in FIG. 1. The result as illustrated by FIG. 4, was a continuous layer 25 of polycrystalline Ge, overlying and in contact with the TiN layer 21. The disclosure is thus also related to a semiconductor substrate comprising a TiN layer at least on a portion of the substrate surface, with a Ge layer overlying and in contact with said TiN layer. The disclosure is equally related to a semiconductor device comprising such a substrate.

What is claimed is:

1. A method, comprising:
providing a substrate, wherein said substrate comprises a substrate surface;
introducing said substrate into a reaction chamber, wherein said reaction chamber is configured to apply a layer onto said substrate surface by chemical vapor deposition (CVD);
introducing in said reaction chamber a gas mixture comprising a germanium precursor gas and a non-reactive carrier gas, wherein said germanium precursor gas comprises a higher order germane precursor compared to $GeH_4$; and
depositing by CVD a continuous germanium layer, wherein said continuous germanium layer overlies and is in contact with said substrate surface, and wherein said depositing by CVD is performed at a deposition temperature between 275° C. and 500° C., and wherein a partial pressure of said germanium precursor gas in said gas mixture is at least 20 mTorr when said deposition temperature is between 275° C. and 285° C., and at least 10 mTorr when said deposition temperature is between 285° C. and 500° C.

2. The method of claim 1, wherein said germanium precursor gas is $Ge_2H_6$.

3. The method of claim 1, wherein said germanium precursor gas is $Ge_3H_8$.

4. The method of claim 1, wherein said gas mixture is at atmospheric pressure.

5. The method of claim 1, wherein said substrate surface comprises a high-K dielectric material.

6. The method of claim 1, wherein said substrate surface comprises silicon oxide.

7. The method of claim 1, wherein said substrate surface comprises silicon nitride.

8. The method of claim 1, wherein said substrate surface comprises silicon carbide.

9. The method of claim 1, wherein said substrate surface comprises a metal.

10. The method of claim 1, wherein said substrate surface comprises a metal nitride.

11. The method of claim 1, wherein said substrate surface comprises a metal carbide.

12. The method of claim 1, wherein said substrate surface comprises titanium nitride.

13. The method of claim 1, wherein said substrate surface comprises silicon dioxide.

14. The method of claim 1, wherein said gas mixture further comprises a dopant gas, wherein said dopant gas comprises a doping element.

15. The method of claim 14, wherein said dopant gas is a material selected from the group consisting of $B_2H_6$, $AsH_3$ and $PH_3$.

16. The method of claim 1, wherein said non-reactive carrier gas is a material selected from the group consisting of $H_2$ and $N_2$.

* * * * *